US012684852B2

(12) United States Patent　　　　(10) Patent No.:　US 12,684,852 B2
Tornblad et al.　　　　　　　　　　(45) Date of Patent:　　　Jul. 14, 2026

(54) FIELD PEAK REDUCTION IN SEMICONDUCTOR DEVICES WITH METAL CORNER ROUNDING

(71) Applicant: Wolfspeed, Inc., Durham, NC (US)

(72) Inventors: Olof Tornblad, San Jose, CA (US); Jia Guo, New Hill, NC (US); Scott Sheppard, Chapel Hill, NC (US)

( * ) Notice: Subject to any disclaimer, the term of this patent is extended or adjusted under 35 U.S.C. 154(b) by 437 days.

(21) Appl. No.: 18/330,013

(22) Filed: Jun. 6, 2023

(65) Prior Publication Data

US 2024/0413218 A1　　Dec. 12, 2024

(51) Int. Cl.
　*H10D 64/27*　　　(2025.01)
　*H10D 30/47*　　　(2025.01)
　*H10D 64/00*　　　(2025.01)
　*H10D 62/85*　　　(2025.01)

(52) U.S. Cl.
　CPC ......... *H10D 64/411* (2025.01); *H10D 30/475* (2025.01); *H10D 64/111* (2025.01); *H10D 62/8503* (2025.01)

(58) Field of Classification Search
　CPC .. H10D 64/411; H10D 64/111; H10D 30/475; H10D 62/8503
　USPC .......................................................... 257/77
　See application file for complete search history.

(56) References Cited

U.S. PATENT DOCUMENTS

| | | |
|---|---|---|
| 4,946,547 A | 8/1990 | Palmour et al. |
| 5,192,987 A | 3/1993 | Khan et al. |

| | | |
|---|---|---|
| 5,200,022 A | 4/1993 | Kong et al. |
| 5,210,051 A | 5/1993 | Carter, Jr. |
| 5,296,395 A | 3/1994 | Khan et al. |
| RE34,861 E | 2/1995 | Davis et al. |
| 5,393,993 A | 2/1995 | Edmond et al. |
| 5,523,589 A | 6/1996 | Edmond et al. |
| 6,218,680 B1 | 4/2001 | Carter, Jr. et al. |
| 6,316,793 B1 | 11/2001 | Sheppard et al. |
| 6,548,333 B2 | 4/2003 | Smith |
| 7,030,428 B2 | 4/2006 | Saxler |
| 7,045,404 B2 | 5/2006 | Sheppard et al. |
| 7,544,963 B2 | 6/2009 | Saxler |
| 7,548,112 B2 | 6/2009 | Sheppard |
| 7,592,211 B2 | 9/2009 | Sheppard et al. |
| 7,615,774 B2 | 11/2009 | Saxler |
| 7,709,269 B2 | 5/2010 | Smith et al. |
| 7,709,859 B2 | 5/2010 | Smith et al. |
| 8,049,252 B2 | 11/2011 | Smith et al. |
| 8,120,064 B2 | 2/2012 | Parikh et al. |
| 8,563,372 B2 | 10/2013 | Hagleitner et al. |
| 9,165,766 B2 * | 10/2015 | Keller ................. H01L 21/0254 |
| 9,214,352 B2 | 12/2015 | Hagleitner et al. |
| 10,971,612 B2 | 4/2021 | Bothe et al. |
| 2006/0118809 A1 * | 6/2006 | Parikh ................... H10D 64/111 |
| | | 257/E29.127 |
| 2013/0037852 A1 * | 2/2013 | Tamaki ................ H10D 30/665 |
| | | 257/493 |

(Continued)

*Primary Examiner* — Phuc T Dang

(74) *Attorney, Agent, or Firm* — Dority & Manning, P.A.

(57)　　　　　　ABSTRACT

Transistor devices having metal structures with rounded corners are provided. In one example, the transistor device includes a Group III-nitride semiconductor structure. The transistor device includes a gate contact and/or a field plate on the Group III-nitride semiconductor structure. One or more of the gate contact or the field plate includes at least one rounded corner.

19 Claims, 9 Drawing Sheets

(56)  References Cited

U.S. PATENT DOCUMENTS

2016/0322466 A1* 11/2016 Simin ................. H10D 30/021
2022/0130965 A1    4/2022 Bothe et al.

* cited by examiner

FIELD PEAK REDUCTION IN SEMICONDUCTOR DEVICES WITH METAL CORNER ROUNDING

FIELD

The present disclosure relates generally to semiconductor devices, and more particularly to transistor devices.

BACKGROUND

Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

Power semiconductor devices may be fabricated from wide bandgap semiconductor materials (e.g., having a bandgap greater than 1.40 eV). For example, power HEMTs may be fabricated from gallium nitride (GaN) or other Group III nitride-based material systems that are formed, for instance, on a silicon carbide (SiC) substrate or other substrate. As used herein, the term "Group III nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide bandgap semiconductor materials such as silicon carbide (e.g., 2.996 eV bandgap for alpha silicon carbide at room temperature) and the Group III-nitrides (e.g., 3.36 eV bandgap for gallium nitride at room temperature) may provide higher electric field breakdown strengths and higher electron saturation velocities as compared to gallium arsenide (GaAs) and silicon (Si) based devices.

SUMMARY

Aspects and advantages of embodiments of the present disclosure will be set forth in part in the following description, or may be learned from the description, or may be learned through practice of the embodiments.

One example aspect of the present disclosure is directed to a transistor device. The transistor device includes a Group III-nitride semiconductor structure. The transistor device includes a gate contact on the Group III-nitride semiconductor structure. The gate contact includes at least one rounded corner.

Another example aspect of the present disclosure is directed to s transistor device. The transistor device includes a Group III-nitride semiconductor structure. The transistor device includes a field plate at least partially overlapping the Group III-nitride semiconductor structure. The field plate includes at least one rounded corner.

Another example aspect of the present disclosure is directed to a transistor device. The transistor device includes a substrate. The transistor device includes a Group III-nitride semiconductor structure on the substrate. The Group III-nitride semiconductor structure includes a barrier layer and a channel layer. The barrier layer has a different bandgap relative to the channel layer. The transistor device includes a gate contact, source contact, and a drain contact. The gate contact has an overhang portion extending toward the drain contact or the source contact. The gate contact includes a first rounded corner forming a part of the overhang portion. The gate contact includes a second rounded corner at an intersection between a top surface of the gate contact and a side surface of the gate contact.

Another example aspect of the present disclosure is directed to a transistor device. The transistor device includes a Group III-nitride semiconductor structure on the substrate. The Group III-nitride semiconductor structure includes a barrier layer and a channel layer. The barrier layer has a different bandgap relative to the channel layer. The transistor device includes a gate contact, source contact, and a drain contact. The transistor device includes a field plate. The field plate has a first rounded corner at a portion of the field plate at least partially overlapping the gate contact, a second rounded corner at a portion of the field plate extending away from a gate contact, and a third rounded corner at a portion of the field plate extending toward the gate contact but not overlapping the gate contact.

Another example aspect of the present disclosure is directed to a method of forming a transistor device. The method includes forming a group III-nitride semiconductor structure on a substrate. The method includes forming a gate contact on the Group III-nitride semiconductor structure. The gate contact includes at least one rounded corner.

Another example aspect of the present disclosure is directed to a method of forming a transistor device. The method may include forming a group III-nitride semiconductor structure on a substrate. The method may include forming a field plate at least partially overlapping the Group III-nitride semiconductor structure. The field plate includes at least one rounded corner.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which:

FIGS. 6A-6C provide a comparison of peak electric field of transistor devices with structures having sharp corners relative to transistor devices with structures having rounded corners according to example embodiments of the present disclosure;

FIGS. 7A-7C provide a comparison of peak electric field of transistor devices with structures having sharp corners relative to transistor devices with structures having rounded corners according to example embodiments of the present disclosure;

FIGS. 8A-8C provide a comparison of peak electric field of transistor devices with structures having sharp corners relative to transistor devices with structures having rounded corners according to example embodiments of the present disclosure;

DETAILED DESCRIPTION

Figure 1:
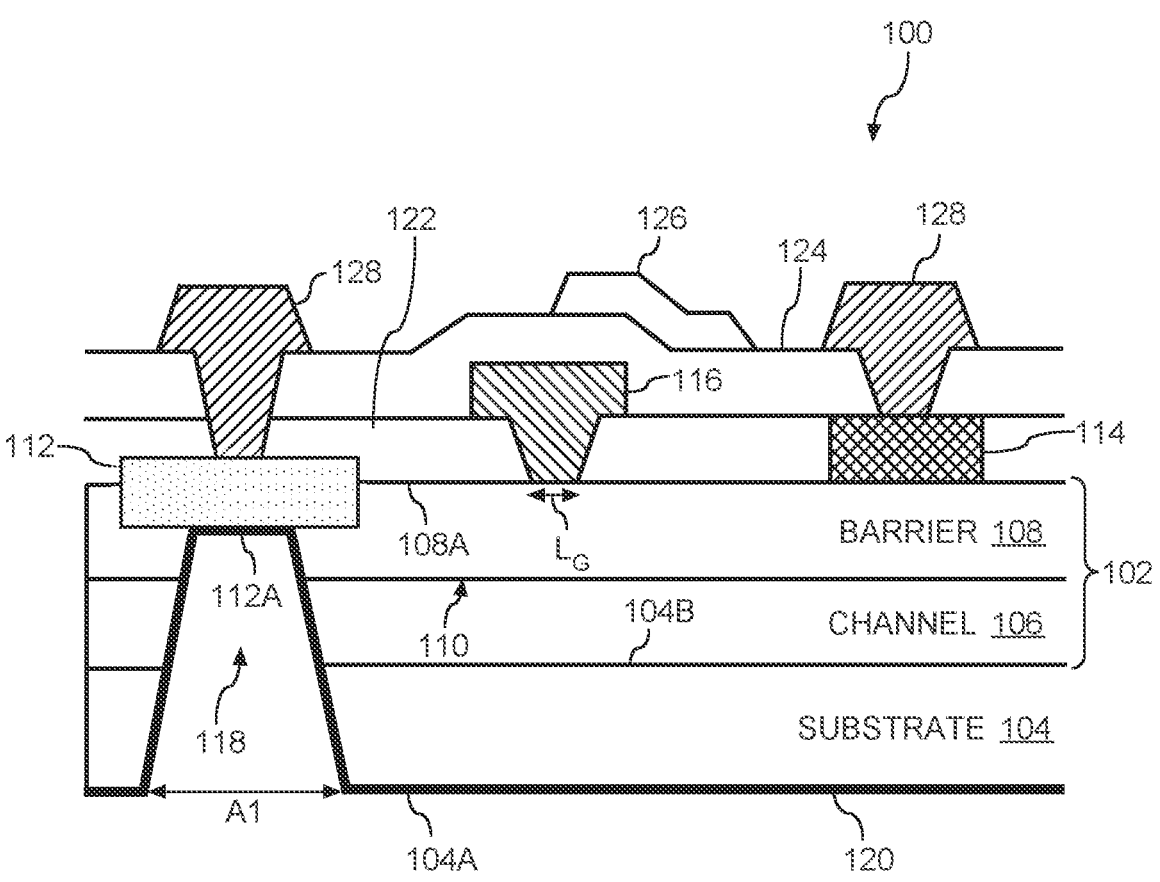
FIG. 1 depicts a cross-sectional view of an example transistor device according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Transistor devices, such as high electron mobility transistors (HEMTs), may be used in power electronics applications. HEMTs fabricated in Group III nitride-based material systems may have the potential to generate large amounts of radio frequency (RF) power because of the combination of material characteristics that includes high breakdown fields, wide bandgaps, large conduction band offset, and/or high saturated electron drift velocity. As such, Group III nitride based HEMTs may be promising candidates for high frequency and/or high-power RF applications, as well as for low frequency high power switching applications, both as discrete transistors or as coupled with other circuit elements, such as in monolithic microwave integrated circuit (MMIC) devices.

Transistor devices such as HEMT devices may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Often, high performance Group III nitride-based HEMT devices may be implemented as depletion mode (normally-on) devices, in that they are conductive at a gate-source bias of zero due to the polarization-induced charge at the interface of the barrier and channel layers of the device.

When an HEMT device is in an ON-state, a two-dimensional electron gas (2DEG) is formed at the heterojunction of two semiconductor materials with different bandgap energies, where the smaller bandgap material has a higher electron affinity. The 2DEG is an accumulation layer in the smaller bandgap material and can include a very high sheet electron concentration. Additionally, electrons that originate in the wider-bandgap semiconductor material transfer to the 2DEG layer, allowing high electron mobility due to reduced ionized impurity scattering. This combination of high carrier concentration and high carrier mobility may give the HEMT device a very large transconductance (which may refer to the relationship between output current and input voltage) and may provide a strong performance advantage over MOS-FETs for high-frequency applications.

Transistor devices, such as HEMT devices, may include structures (e.g., metal structures) that have sharp metal corners at various locations in the transistor device. For instance, a gate contact of a transistor device may have one or more sharp metal corners. A field plate of a transistor device may have one or more sharp metal corners. The sharp metal corners may induce high electric field peaks at locations within the transistor device. The high electric field peaks may lead to failures, for instance, in regions between a gate contact and a field plate, between the gate contact and the semiconductor structure (e.g., Group III nitride-based semiconductor structure), and/or between the field plate and the semiconductor structure. The failures may result from, for instance, shorts or voids in the transistor device.

According to example aspects of the present disclosure, a transistor device, such as a HEMT device, may include metal structure with one or more rounded corners to reduce the peak electric field at locations within the transistor device. For instance, the transistor device may include a gate contact (e.g., T-gate or gamma gate) with one or more rounded corners. In addition or in the alternative, the transistor device may include a field plate with one or more rounded corners.

As used herein, a corner is a "rounded corner" if there is at least one curve or arc at the corner or at an intersection between two surfaces. A rounded corner may have a radius of curvature. The radius of curvature of a rounded corner is the distance from the center point of the arc that defines the curve of the corner to the point where the curve meets the straight edges of the corner. In other words, it is the radius of the circle that matches the curvature of the corner. The larger the radius of curvature, the more gradual the curve of the corner will be, while a smaller radius of curvature will result in a sharper curve. In some examples, the one or more rounded corners may have a radius of curvature in a range of about 10 nm to about 400 nm, such as in a range of about 100 nm to about 200 nm. In some examples, the one or more rounded corners may be based on an ellipse or circles of varying radius such that the at least one rounded corner has a varying radius of curvature along the at least one rounded corner.

The rounded corner may be implemented at various locations in the gate contact and/or in the field plate. For instance, in some examples, the gate contact may include an overhang portion extending toward, for instance, a source contact or a drain contact of the transistor device. The overhang portion may include at least one rounded corner. In some examples, the gate contact may include a top surface and a side surface. The at least one rounded corner may be located at an intersection of the top surface and the side surface.

In some examples, the field plate may include a rounded corner at a portion of the field plate that at least partially overlaps the gate contact. As used herein, a first structure "at least overlaps" a second structure if an axis that is perpendicular to a major surface of the first structure passes through both the first structure and the second structure. In some examples, the field plate may include a rounded corner at a portion of the field plate extending away from the gate contact. In some examples, the field plate may include a rounded corner at a portion of the field plate extending toward the gate contact.

Aspects of the present disclosure provide a number of technical effects and benefits. For instance, the present inventors have discovered that metal structures with rounded corners (e.g., the gate contact and/or the field plate) reduce peak electric field strength at locations within the transistor device. The reduced field peak reduces the likelihood of failure of the transistor device (e.g., due to shorts or voids) in regions between, for instance, the field plate and gate contact, between the gate contact and the semiconductor structure of the transistor device, or between the field plate and the semiconductor structure of the transistor device.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to an HEMT transistor device for purposes of illustration and discussion. Those of ordinary skill in the art, using the disclosures provided herein, will appreciate that certain aspects of the present disclosure may be applicable to other transistor devices without deviating from the scope of the present disclosure. For instance, aspects of the present disclosure may be implemented in any transistor having a field plate or other transistors devices with metal structures, such as silicon carbide-based MOSFETS.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

FIG. 1 depicts a cross-sectional view of an example HEMT device 100 according to example embodiments of the present disclosure. FIG. 1 is intended to represent structures for identification and description and is not intended to represent the structures to physical scale. The HEMT device 100 may include a semiconductor structure 102. The semiconductor structure 102 may be a Group III nitride semiconductor structure.

As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. The semiconductor structure 102 may be metal-polar. However, aspects of the present disclosure are applicable to semiconductor devices having N-polar semiconductor structures without deviating from the scope of the present disclosure.

The semiconductor structure 102 may be on a substrate 104. The substrate 104 may be a semiconductor material. For instance, the substrate 104 may be a silicon substrate, a silicon carbide (SiC) substrate, a sapphire substrate, or other suitable substrate. In some embodiments, the substrate 104 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 104 may have a resistivity equal to or higher than about $1 \times 10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200, 022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (Al-GaN), gallium nitride (GaN), silicon (Si), GaAs, LGO, zinc oxide (ZnO), LAO, indium phosphide (InP), and the like. The substrate 104 may be a SiC wafer, and the HEMT device 100 may be formed, at least in part, via wafer-level processing, and the wafer may then be diced to provide a plurality of individual HEMT devices 100.

The substrate 104 may have a lower surface 104A and an upper surface 104B. In some embodiments, the substrate 104 of the HEMT device 100 may be a thinned substrate 104. In some embodiments, the thickness of the substrate 104 (e.g., in a vertical Z direction in FIG. 1) may be about 100 μm or less, such as about 75 μm or less, such as about 50 μm or less.

The HEMT device 100 may include a channel layer 106 on the upper surface 104B of the substrate 104 (or on the optional layers described further herein, such as an optional buffer layer or nucleation layer). The HEMT device 100 may include a barrier layer 108 on an upper surface of the channel layer 106. In some embodiments, the channel layer 106 and the barrier layer 108 may each be formed by epitaxial growth. Techniques for epitaxial growth of Group III nitrides have been described in, for example, U.S. Pat. Nos. 5,210,051, 5,393,993, and 5,523,589, the disclosures of which are incorporated by reference herein. The channel layer 106 may have a bandgap that is less than the bandgap of the barrier layer 108. The channel layer 106 may have a larger electron affinity than the barrier layer 108. The channel layer 106 and the barrier layer 108 may include Group III-nitride based materials.

In some embodiments, the channel layer 106 may be a Group III nitride, such as $Al_wGa_{1-w}N$, where $0 \leq w < 1$, provided that the energy of the conduction band edge of the channel layer 106 is less than the energy of the conduction band edge of the barrier layer 108 at the interface between the channel layer 106 and barrier layer 108. In some embodiments, the aluminum mole fraction w is approximately 0, indicating that the channel layer 106 is GaN. The channel layer 106 may or may not include other Group III-nitrides such as InGaN, AlInGaN or the like. The channel layer 106 may be undoped ("unintentionally doped") and may be grown to a thickness in the range of about 0.5 μm to about 5 μm, such as about 2 μm. The channel layer 106 may be a multi-layer structure, such as a superlattice or combinations of GaN, AlGaN or the like. The channel layer 106 may be under compressive strain in some embodiments.

The semiconductor structure 102 may include a barrier layer 108 on an upper surface of the channel layer 106. The barrier layer 108 may have a bandgap that is different from the bandgap of the channel layer 106. The energy of the conduction band edge of the barrier layer 108 may be greater than the energy of the conduction band edge of the channel layer 106 at the interface between the channel layer 106 and the barrier layer 108. The barrier layer 108 may be a Group III-nitride, such as $Al_xGa_{1-x}N$, where x is the aluminum mole fraction in the barrier layer 108. In some embodiments, the aluminum mole fraction x is such that x is in a range of about 0.15 to about 0.40, such as about 0.20 to about 0.25, such as about 0.22 (e.g., the aluminum mole fraction is in a range of 15% to 40%, such as in a range of about 20% to about 25%, such as about 22%), indicating that the barrier layer is an AlGaN layer. The barrier layer 108 may include other Group III elements (e.g., In) without deviating from the scope of the present disclosure. The barrier layer 108, in some examples, may be a multilayer structure. The multilayer structure may include multiple Group III nitride-based layers with differing aluminum mole fractions. The barrier layer 108 may have a thickness in a range of about 10 Angstroms to about 300 Angstroms, such as about 120 Angstroms to about 170 Angstroms, such as about 150 Angstroms.

The channel layer 106 and/or the barrier layer 108 may be deposited, for example, by metal-organic chemical vapor deposition (MOCVD), molecular beam epitaxy (MBE), or hydride vapor phase epitaxy (HVPE). A 2DEG 110 may be induced in the channel layer 106 at an interface between the channel layer 106 and the barrier layer 108. The 2DEG 110 is highly conductive and allows conduction between the source and drain regions of the HEMT device 100.

While the HEMT device 100 is shown with a substrate 104, channel layer 106 and barrier layer 108 for purposes of illustration, the HEMT device 100 may include additional layers/structures/elements. For instance, the HEMT device 100 may include a buffer layer and/or nucleation layer(s) between substrate 104 and the channel layer 106. For example, an AlN buffer layer may be on the upper surface 104B of the substrate 104 to provide an appropriate crystal structure transition between a SiC substrate 104 and the channel layer 106. The optional buffer/nucleation/transition layers may be deposited by MOCVD, MBE, and/or HYPE.

The HEMT device 100 may include a cap layer on the barrier layer 108. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,709,269, 7,709,859 and 10,971,612, the disclosures of which are incorporated by reference herein. Additionally, strain balancing transition layer(s) may also and/or alternatively be provided as described, for example, in U.S. Pat. No. 7,030,428, the disclosure of which is incorporated by reference herein.

The HEMT device 100 may include a source contact 112 on an upper surface 108A of the barrier layer 108 or otherwise contacting the barrier layer 108. The HEMT device 100 may include a drain contact 114 on the upper surface 108A of the barrier layer 108 or otherwise contacting the barrier layer 108. The source contact 112 and the drain contact 114 may be laterally spaced apart from each other. In some embodiments, the source contact 112 and the drain contact 114 may include a metal that may form an ohmic contact to a Group III-nitride based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), Ni, gold (Au), aluminum (Al), tantalum (Ta), molybdenum (Mo), $NiSi_x$, titanium silicide (TiSi), titanium nitride (TiN), tungsten silicon nitride (WSiN), platinum (Pt) and the like. In some embodiments, the source contact 112 may be an ohmic source contact 112. The drain contact 114 may be an ohmic drain contact 114. Thus, the source contact 112 and/or the drain contact 114 may include an ohmic contact portion in direct contact with the barrier layer 108. In some embodiments, the source contact 112 and/or the drain contact 114 may include a plurality of layers to form an ohmic contact that may be provided as described, for example, in U.S. Pat. Nos. 8,563,372 and 9,214,352, the disclosures of which are incorporated by reference herein.

The HEMT device 100 may include a gate contact 116 on the upper surface 108A of the barrier layer 108 or otherwise contacting the barrier layer 108 (e.g., recessed into the barrier layer 108). The gate contact 116 may have a gate length $L_G$. The gate length $L_G$ may be the length of the gate contact 116 at the portion of the gate contact 116 that is on the semiconductor structure 102 as illustrated in FIG. 1. In some embodiments, the gate length $L_G$ may be in the range of about 100 nm to about 400 nm, such as about 100 nm to about 350 nm. In some embodiments, the gate length $L_G$ may be about 100 nm or less, such as about 90 nm or less, such as about 60 nm or less. In some embodiments, the gate length $L_G$ may be in a range of about 40 nm to about 90 nm.

The material of the gate contact 116 may be chosen based on the composition of the barrier layer 108, and may, in some embodiments, be a Schottky contact. Materials capable of making a Schottky contact to a Group III-nitride based semiconductor material may be used. such as, for example, nickel (Ni), platinum (Pt), nickel silicide ($NiSi_x$), copper (Cu), palladium (Pd), chromium (Cr), tungsten (W) and/or tungsten silicon nitride (WSiN).

The source contact 112 may be coupled to a reference signal such as, for example, a ground voltage or other reference signal. The coupling to the reference signal may be provided by a via 118 that extends from a lower surface 104A of the substrate 104, through the substrate 104 and the channel layer 106 to the upper surface 108A of the barrier layer 108. The via 118 may expose a bottom surface of the ohmic portion 112A of the source contact 112. A back metal layer 120 may be on the lower surface 104A of the substrate 104 and on side walls of the via 118. The back metal layer 120 may directly contact the ohmic portion 112A of the source contact 112. In some embodiments a contact area between the back metal layer 120 and the bottom surface of the ohmic portion 112A of the source contact 112 may be fifty percent or more of an area of the bottom surface of the ohmic portion 112A of the source contact 112. Thus, the back metal layer 120, and a signal coupled thereto, may be electrically connected to the source contact 112.

In some embodiments, the via 118 may have an oval or circular cross-section when viewed in a plan view. However, the present disclosure is not limited thereto. In some embodiments, a cross-section of the via 118 may be a polygon or other shape, as will be understood by one of ordinary skill in the art using the disclosures provided herein. In some embodiments, dimensions of the via (e.g., a length and/or a width) may be such that a largest cross-sectional area Al of the via 118 is about 1000 $\mu m^2$ or less. The cross-sectional area A1 may be taken in a direction that is parallel to the lower surface 104A of the substrate 104 (e.g., the X-Y plane of FIG. 1). In some embodiments, the largest cross-sectional area A1 of the via 118 may be that portion of the via 118 that is adjacent the lower surface 104A of the substrate 104 (e.g., the opening of the via 118). For example, in some embodiments, a greatest width (e.g., in the X direction in FIG. 1) may be about 16 μm and a greatest length (e.g., in the Y direction in FIG. 1) may be about 40 μm, though the present disclosure is not limited thereto. In some embodiments, sidewalls of the via 118 may be inclined and/or slanted with respect to the lower surface 104A of the substrate 104. In some embodiments, the sidewalls of the via 118 may be approximately perpendicular to the lower surface 104A of the substrate 104.

Depending on the embodiment, the drain contact 114 may be formed on, in and/or through the barrier layer 108, and there can be ion implantation into the materials around the drain contact 114 (e.g., through the barrier layer 108 and into the channel layer 106) to reduce resistivity and provide improved ohmic contact to the semiconductor material. In yet other embodiments, there is no source via 118, and the source contact 112 is formed on, in and/or through the barrier layer 108, and there can be ion implantation in the materials around the source contact 112 to reduce resistivity and provide improved ohmic contact to the semiconductor material. In some examples, the connections to the source contact 112, drain contact 114, and/or gate contact 116 can be made from the top and/or the bottom to provide for flip chip configuration of the HEMT device 100. In some examples, thermal paths may be provided from the top and/or bottom to provide for flip chip configuration of the HEMT device 100.

The HEMT device 100 may include a first insulating layer 122. The first insulating layer 122 may directly contact the upper surface of the semiconductor structure 102 (e.g., contact the upper surface 108A of the barrier layer 108). The HEMT device 100 may include a second insulating layer 124. The second insulating layer 124 may be on the first insulating layer 122. It will also be appreciated that more than two insulating layers may be included in some embodiments. The first insulating layer 122 and/or the second insulating layer 124 may serve as passivation layers for the HEMT device 100. The first insulating layer 122 and/or the second insulating layer 124 may be dielectric layers. Different dielectric materials may be used such as a SiN, SiO2, $Al_2O_3$, MgOx, MgNx, ZnO, SiNx, SiOx, alloys or layer sequences thereof, or epitaxial materials.

The source contact 112, the drain contact 114, and the gate contact 116 may be in the first insulating layer 122. In some embodiments, at least a portion of the gate contact 116 may be on the first insulating layer 122. In some embodiments, the gate contact 116 may be a T-shaped gate and/or a gamma gate, the formation of which is discussed by way of example in U.S. Pat. Nos. 8,049,252, 7,045,404, and 8,120,064, the disclosures of which are incorporated by reference herein. The second insulating layer 124 may be on the first insulating layer 122 and on portions of the source contact 112, drain contact 114, and gate contact 116. The protrusions from the gate can also be referred to as a field plate integrated with the gate.

A field plate 126 may be on the second insulating layer 124 as illustrated in FIG. 1, or on another insulating layer depending on the number of insulating layers included in the HEMT device. At least a portion of a field plate 126 may be at least partially overlapping the gate contact 116. At least a portion of the field plate 126 may be on a portion of the second insulating layer 124 that is between the gate contact 116 and the drain contact 114. The field plate 126 may reduce the peak electric field in the HEMT device 100, which may result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is incorporated by reference herein.

Metal contacts 128 may be disposed in the second insulating layer 124 as illustrated in FIG. 1, or on another insulating layer depending on the number of insulating layers included in the HEMT device. The metal contacts 128 may provide interconnection between the source contact 112 and other parts of the HEMT device 100, or may provide interconnection between the drain contact 114, and other parts of the HEMT device 100. Respective ones of the metal contacts 128 may directly contact respective ones of the drain contact 114 and/or source contact 112. The metal contacts 128 may include metal or other highly conductive material, including, for example, copper, cobalt, gold, and/or a composite metal.

A HEMT transistor may be formed by the active region between the source contact 112 and the drain contact 114 under the control of a gate contact 116 between the source contact 112 and the drain contact 114. FIG. 1 depicts a cross-sectional view of one unit of an HEMT device 100 for purposes of illustration. The HEMT device 100 may be formed adjacent to additional HEMT device units and may share, for instance, a source contact 112 with adjacent HEMT device units.

According to example embodiments, a metal structure (e.g., the gate contact 116 or the field plate 126) of the HEMT device 100 may include one or more rounded metal corners to reduce a peak electric field within certain portions of the HEMT device 100, such as at portions between the gate contact 116 and field plate 126, between the gate contact 116 and the semiconductor structure 102, and/or between the field plate 126 and the semiconductor structure 102.

Figure 2:
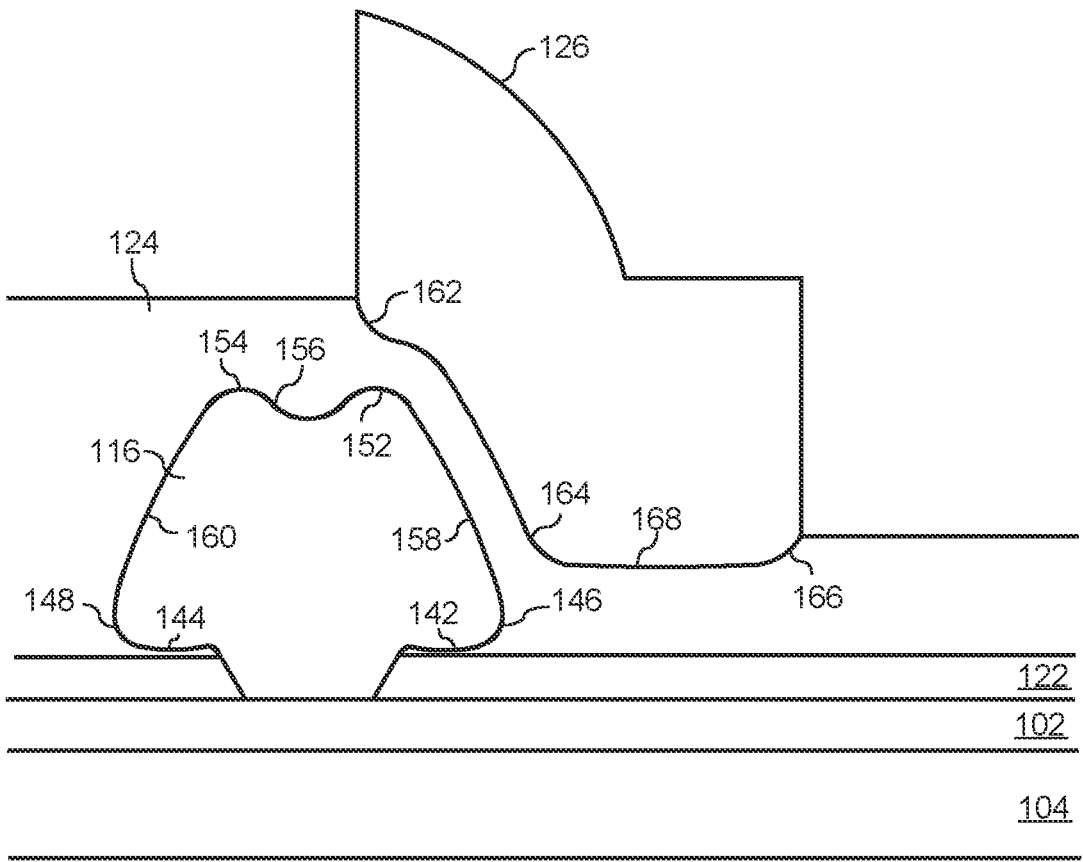
FIG. 2 depicts a close-up view of a gate structure and a field plate structure having rounded corners according to example embodiments of the present disclosure.

FIG. 2 depicts a close up of a gate contact 116 and a field plate 126 of an HEMT device 100 according to example embodiments of the present disclosure. The gate contact 116 is on the semiconductor structure 102. The semiconductor structure 102 is on the substrate 104. The insulating layers 122 and 124 are on the semiconductor structure 102. FIG. 2 is intended to represent structures for identification and description and is not intended to represent the structures to physical scale.

As shown in FIG. 2, the gate contact 116 is a T-gate. The gate contact 116 has a first overhang portion 142 extending toward a drain contact (not shown). The gate contact 116 also has a second overhang portion 144 extending toward a source contact (not shown). The first overhang portion 142 and the second overhang portion 144 each at least partially overlap the semiconductor structure 102. In this way, the gate contact 116 forms a T-shape. FIG. 2 is discussed with reference to a T-gate for purposes of illustration and discussion. Those or ordinary skill in the art, using the disclosures provided herein, will understand that aspects of the present disclosure may be implemented with gate contacts having different shapes without deviating from the scope of the present disclosure. For instance, the gate contact 116 may be a gamma gate (e.g., as discussed with reference to FIG. 4. In a gamma gate, the gate contact 116 may only have a single overhang portion extending in one direction (e.g., toward the drain contact) so that the gate contact 116 forms a gamma shape. Alternatively, it could have different overhang extensions towards source and drain.

The gate contact 116 may include a rounded corner 146 in the first overhang portion 142 extending toward the drain contact (not shown in FIG. 2). In addition or in the alternative, the gate contact 116 may include a rounded corner 148 in the second overhang portion 144 extending toward the source contact (not shown in FIG. 2). In addition or in the alternative, the gate contact 116 may include a rounded corner 152 at a top surface 156 of the gate contact. As used herein, the top surface 156 of the gate contact 116 refers to the surface away from the semiconductor structure 102. The rounded corner 152 may be at an intersection of the top surface 156 and a side surface 158 of the gate contact 116. In addition or in the alternative, the gate contact 116 may include a rounded corner 154 in the top surface 156 of the gate contact 116 at an intersection of the top surface 156 and a side surface 160 of the gate contact 116.

As will be discussed in more detail with reference to FIG. 3, one or more of rounded corner 146, rounded corner 148, rounded corner 152, and rounded corner 154 may have a radius of curvature in a range of about 10 nm to about 400 nm, such as in a range of about 100 nm to about 200 nm. In some examples, one or more of rounded corner 146, rounded corner 148, rounded corner 152, or rounded corner 154 may be based on an ellipse or circles of varying radius such that the at least one rounded corner has a varying radius of curvature along the at least one rounded corner.

FIG. 2 depicts an example where the gate contact 116 has four rounded corners. The gate contact 116 may have more or fewer rounded corners without deviating from the scope of the present disclosure. The remaining corners of the gate contact 116 that are not rounded corners may be square or sharp corners. For instance, in some examples, the gate contact 116 may only have the rounded corner 146. In some examples, the gate contact 116 may only have the rounded corner 148. In some examples, the gate contact 116 may only have the rounded corner 152. In some examples, the gate contact 116 may only have the rounded corner 154. In some examples, the gate contact 116 may have two rounded corners. In some examples, the gate contact 116 may have three rounded corners.

In the example of FIG. 2, the field plate 126 includes one or more rounded corners. For instance, the field plate 126 may include a rounded corner 162. The rounded corner 162 may be located at least partially overlapping the gate contact 116. The insulating layer 124 may be between the rounded corner 162 and the top surface 156 of the gate contact 116.

In addition or in the alternative, the field plate 126 may include a rounded corner 164. The rounded corner 164 may be located at a portion of the field plate 126 (e.g., on a lower surface 168 of the field plate 126) extending toward the gate contact 116. The insulating layer 124 may be between the rounded corner 164 and the side surface 158 of the gate contact 116.

In addition or in the alternative, the field plate 126 may include a rounded corner 166. The rounded corner 166 may be located at a portion of the field plate 126 (e.g., on a lower surface 168 of the field plate 126) extending away from the gate contact 116. The rounded corner 166 may be at least partially overlapping the semiconductor structure 102 and not overlapping the gate contact 116.

As will be discussed in more detail with reference to FIG. 3, one or more of rounded corner 162, rounded corner 164, and rounded corner 166 may have a radius of curvature in a range of about 10 nm to about 400 nm, such as in a range of about 100 nm to about 200 nm. In some examples, one or more of rounded corner 162, rounded corner 164, and rounded corner 166 may be based on an ellipse or circles of varying radius such that the at least one rounded corner has a varying radius of curvature along the at least one rounded corner.

FIG. 2 depicts an example where field plate 126 has three rounded corners. The field plate 126 may have more or fewer rounded corners without deviating from the scope of the present disclosure. The remaining corners of the field plate 126 that are not rounded corners may be square or sharp corners. For instance, in some examples, the field plate 126 may only have one rounded corner 162. In some examples, the field plate 126 may only have the rounded corner 164. In some examples, the field plate 126 may only have the rounded corner 166. In some examples, the field plate 126 may have two rounded corners.

Figure 3:
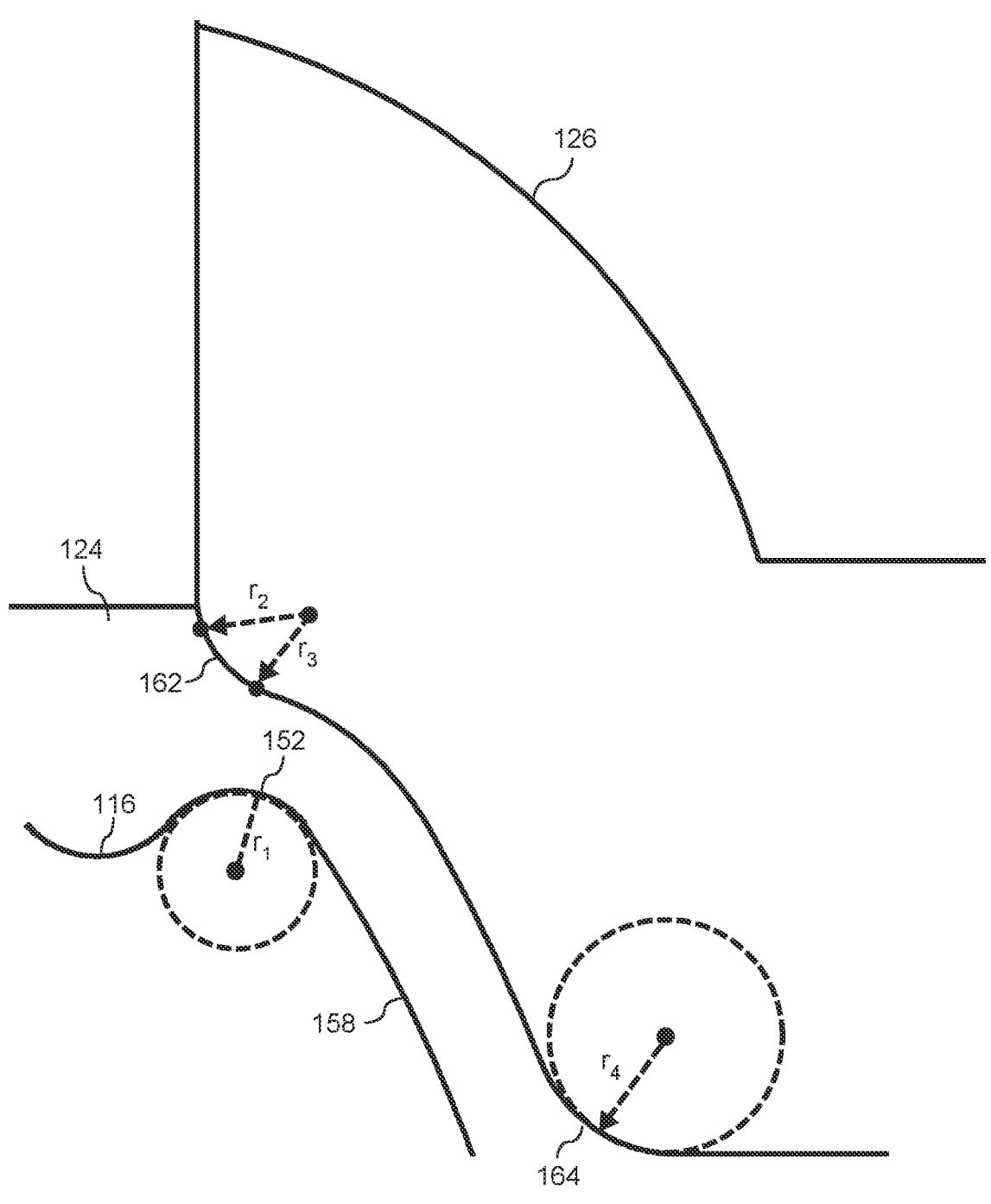
FIG. 3 depicts a close-up view of a gate structure and a field plate structure having rounded corners according to example embodiments of the present disclosure.

FIG. 3 depicts a close-up view of a portion of the field plate 126 and the gate contact 116 of the HEMT device 100 of FIG. 1. As shown in FIG. 3, the rounded corner 152 has a radius of curvature r1. The radius of curvature r1 of the rounded corner is the distance from the center point of the arc that defines the curve of the rounded corner 152 to the point where the curve meets the straight edges of the corner. In other words, it is the radius of the circle that matches the curvature of the corner. The radius of curvature rl of the rounded corner may be, for instance, in a range of about 10 nm to about 400 nm, such as in a range of about 100 nm to about 200 nm.

The rounded corner 162 in the field plate 126 may have a varying radius of curvature along the rounded corner 162. For instance, the radius of curvature may transition in a continuously varying manner from a first radius of curvature r2 to a second radius of curvature r3 along the rounded corner 162. In this way, the rounded corner 162 may be defined by an arc or curve that is elliptical. The continuously varying transition from the first radius of curvature r2 to the second radius of curvature may be defined based on a linear function, exponential function, or other function.

The rounded corner 164 has a radius of curvature r4. The radius of curvature r4 of the rounded corner is the distance from the center point of the arc that defines the curve of the rounded corner 164 to the point where the curve meets the straight edges of the corner. In other words, it is the radius of the circle that matches the curvature of the corner. The radius of curvature r4 of the rounded corner may be, for instance, in a range of about 10 nm to about 400 nm, such as in a range of about 100 nm to about 200 nm.

The radius of curvature of the each of the rounded corners of the metal structures described herein may be the same or may be different without deviating from the scope of the present disclosure. For instance, r1 may be the same as r4 in some examples. However, in other examples, r1 may be different from r4.

Figure 4:
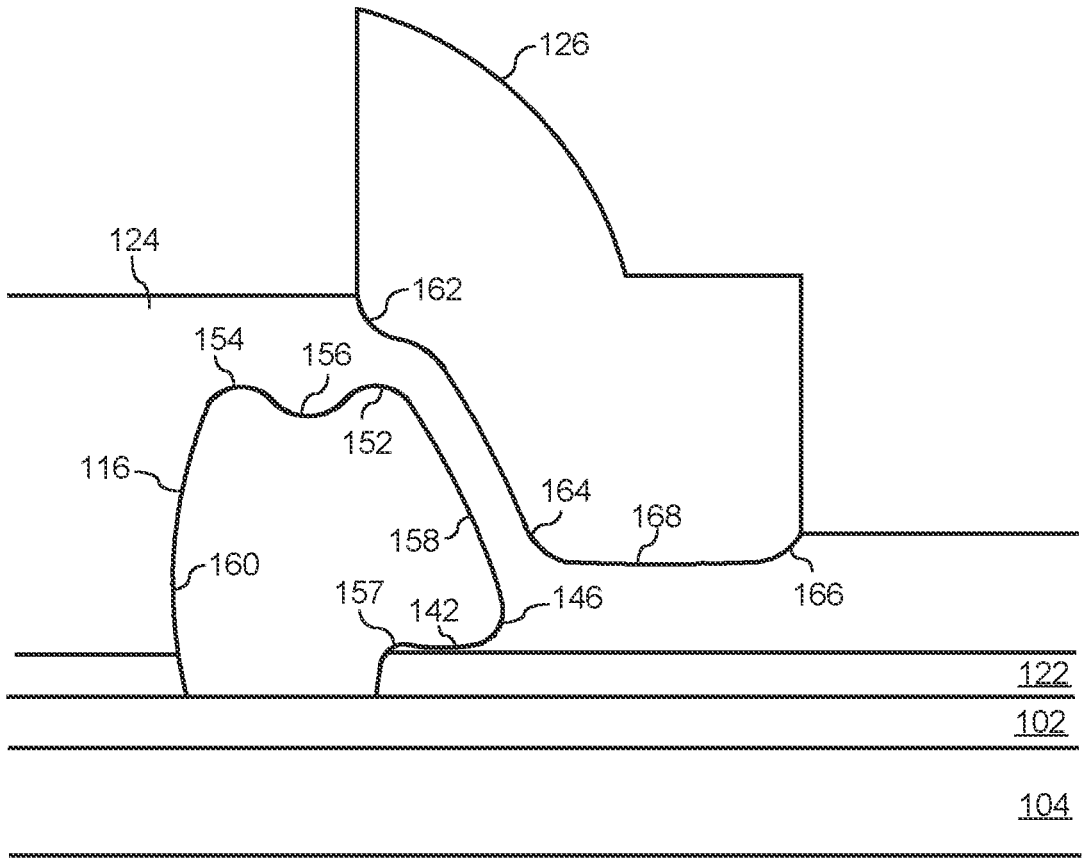
FIG. 4 depicts a close-up view of a gate structure and a field plate structure having rounded corners according to example embodiments of the present disclosure.

FIG. 4 depicts a close-up view of a portion of the field plate 126 and a gate contact 116 of an HEMT device according to example embodiments of the present disclosure. The example of FIG. 4 is similar to that of FIG. 2, except that the gate contact 116 is a gamma gate. For instance, the gate contact 116 may be a gamma gate (e.g., as discussed with reference to FIG. 4. In a gamma gate, the gate contact 116 may only have a single overhang portion extending in one direction (e.g., toward the drain contact) so that the gate contact 116 forms a gamma shape. Alternatively, it could have different overhang extensions towards source and drain.

The gate contact 116 may include a rounded corner 146 in the first overhang portion 142 extending toward the drain contact. In addition, or in the alternative, the gate contact 116 may include a rounded corner 152 at a top surface 156 of the gate contact. The rounded corner 152 may be at an intersection of the top surface 156 and a side surface 158 of the gate contact 116. In addition, or in the alternative, the gate contact 116 may include a rounded corner 154 in the top surface 156 of the gate contact 116 at an intersection of the top surface 156 and a side surface 160 of the gate contact 116. In addition, or in the alternative, the gate contact 116 may include a rounded corner 157 at a portion of the gate contact 116 where the overhang portion 142 first extends from the gate contact 116.

One or more of rounded corner 146, rounded corner 152, rounded corner 154, and rounded corner 157 may have a radius of curvature in a range of about 10 nm to about 400 nm, such as in a range of about 100 nm to about 200 nm. In some examples, one or more of rounded corner 146, rounded corner 152, rounded corner 154, or rounded corner 157 may be based on an ellipse or circles of varying radius such that the at least one rounded corner has a varying radius of curvature along the at least one rounded corner.

Figure 5:
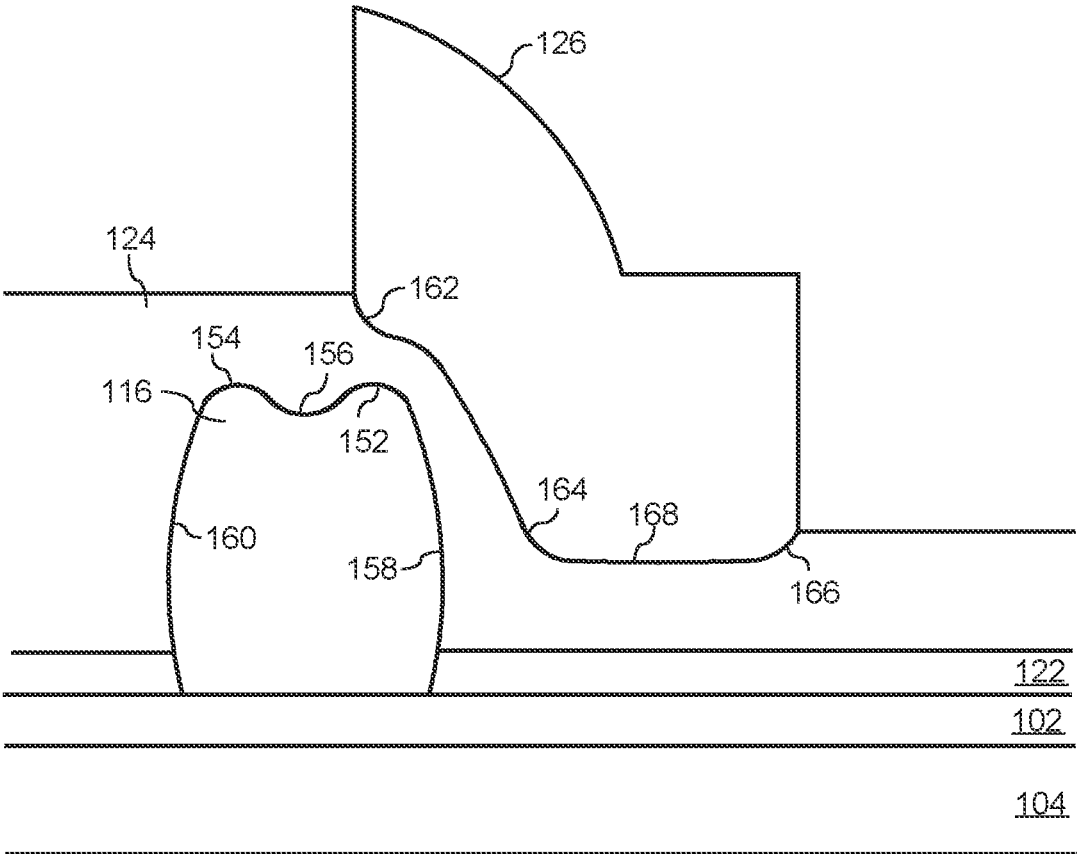
FIG. 5 depicts a close-up view of a gate structure and a field plate structure having rounded corners according to example embodiments of the present disclosure.

FIG. 5 depicts a close-up view of a portion of the field plate 126 and a gate contact 116 of an HEMT device according to example embodiments of the present disclosure. The example of FIG. 5 is similar to that of FIGS. 2 and 4, except that the gate contact 116 does not have any overhang portion. The gate contact 116 may include a rounded corner 152 at a top surface 156 of the gate contact. The rounded corner 152 may be at an intersection of the top surface 156 and a side surface 158 of the gate contact 116. In addition or in the alternative, the gate contact 116 may include a rounded corner 154 in the top surface 156 of the gate contact 116 at an intersection of the top surface 156 and a side surface 160 of the gate contact 116.

One or more of the rounded corner 152 and the rounded corner 154 may have a radius of curvature in a range of about 10 nm to about 400 nm, such as in a range of about 100 nm to about 200 nm. In some examples, one or more of the rounded corner 152 and the rounded corner 154 may be based on an ellipse or circles of varying radius such that the at least one rounded corner has a varying radius of curvature along the at least one rounded corner.

Figure 6C:
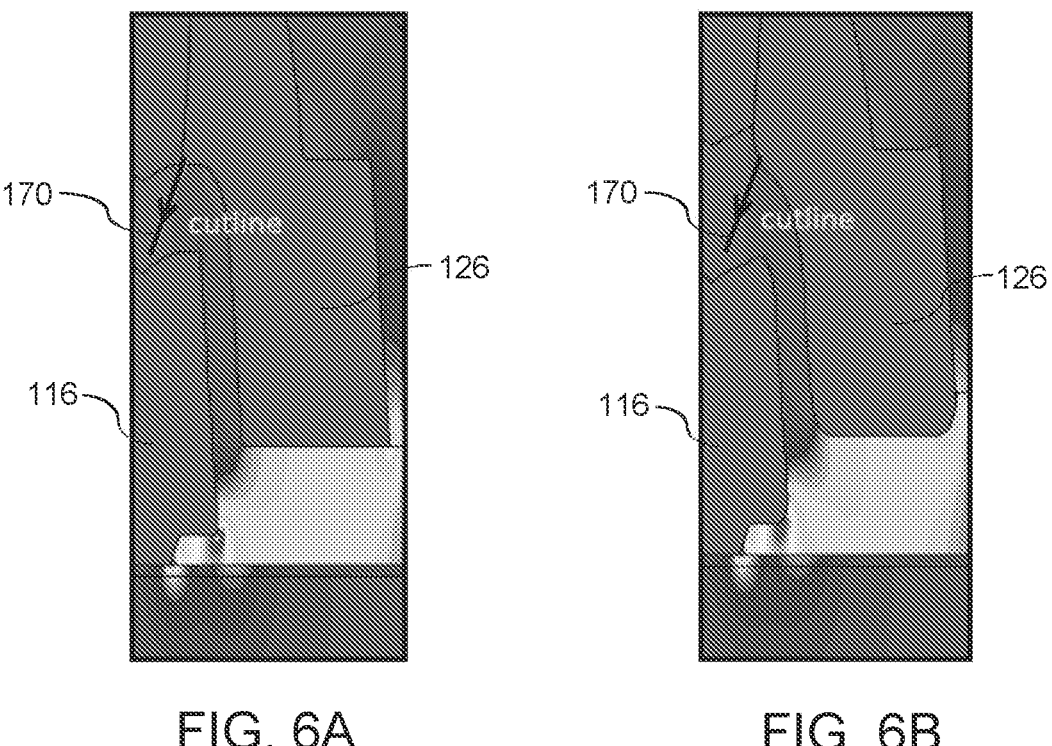
Figure 6C:
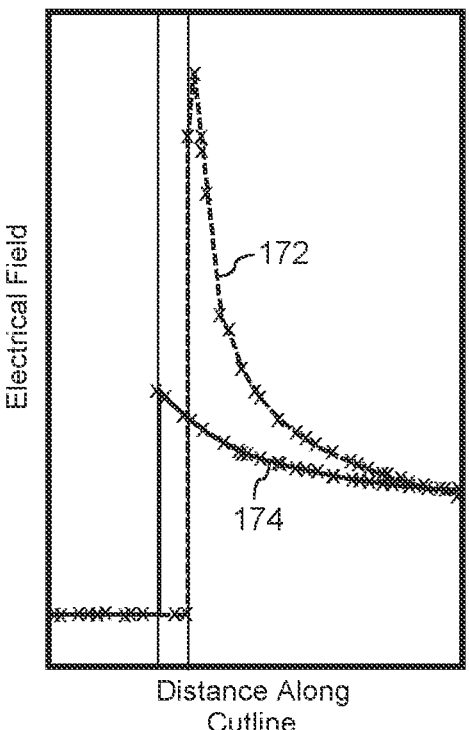

FIGS. 6A, 6B, and 6C provide a comparison of peak electric field of transistor devices with structures having sharp corners relative to transistor devices with structures having rounded corners according to example embodiments of the present disclosure. More particularly, FIG. 6A depicts a simulation of two-dimensional electric field distribution for an HEMT device with metal structures with sharp corners at a drain-source voltage (Vds) equal to about 150V and gate source voltage (Vgs) equal to about −8V. FIG. 6B depicts a simulation of two-dimensional electric field distribution for an HEMT device with metal structures with rounded corners according to example embodiments of the present disclosure at a drain-source voltage (Vds) equal to about 150V and gate source voltage (Vgs) equal to about −8V.

FIG. 6C depicts a electric field along cutline 170 in FIGS. 6A and 6B. FIG. 6C plots distance along the cutline 170 along the horizontal axis and electric field along the vertical axis. Curve 172 represents the electric field for the HEMT device with sharp corners in FIG. 6A. Curve 174 represents the electric field for the HEMT device with rounded corners in FIG. 6B. As demonstrated in FIG. 6C, the HEMT device with rounded corners demonstrates a reduction in peak electric field along cutline 170 at a location between the field plate 126 and a top surface of the gate contact 116.

Figure 7C:
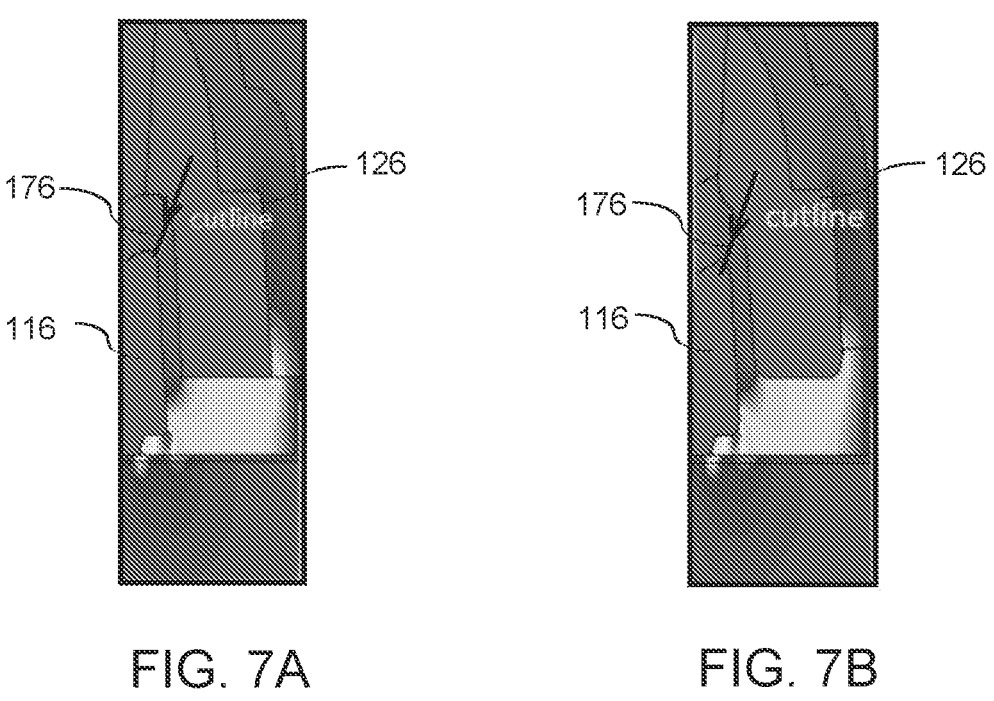
Figure 7C:
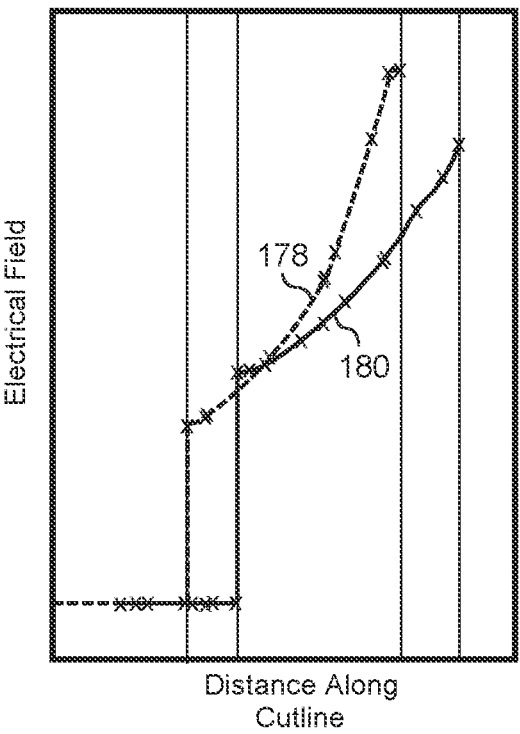

FIGS. 7A, 7B, and 7C provide a comparison of peak electric field of transistor devices with structures having sharp corners relative to transistor devices with structures having rounded corners according to example embodiments of the present disclosure. More particularly, FIG. 7A depicts a simulation of two-dimensional electric field distribution for an HEMT device with metal structures with sharp corners at a drain-source voltage (Vds) equal to about 150V and gate source voltage (Vgs) equal to about –8V. FIG. 7B depicts a simulation of two-dimensional electric field distribution for an HEMT device with metal structures with rounded corners according to example embodiments of the present disclosure at a drain-source voltage (Vds) equal to about 150V and gate source voltage (Vgs) equal to about –8V.

FIG. 7C depicts a electric field along cutline 176 in FIGS. 7A and 7B. FIG. 7C plots distance along the cutline 176 along the horizontal axis and electric field along the vertical axis. Curve 178 represents the electric field for the HEMT device with sharp corners in FIG. 7A. Curve 180 represents the electric field for the HEMT device with rounded corners in FIG. 7B. As demonstrated in FIG. 7C, the HEMT device with rounded corners demonstrates a reduction in peak electric field along cutline 176 at a location between the field plate 126 and a top surface of the gate contact 116.

Figure 8C:
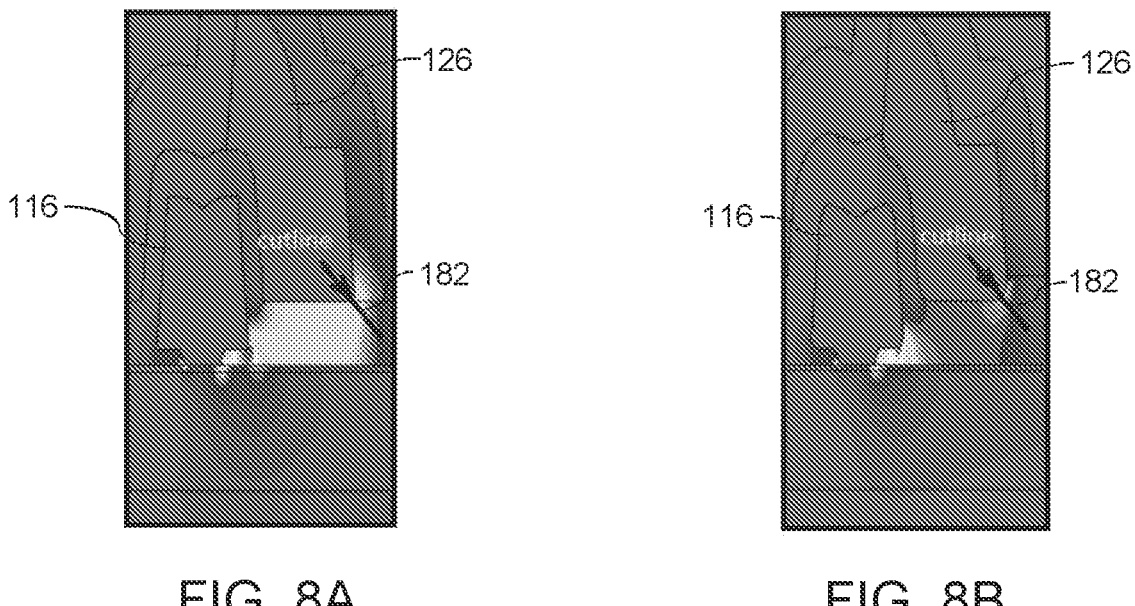
Figure 8C:
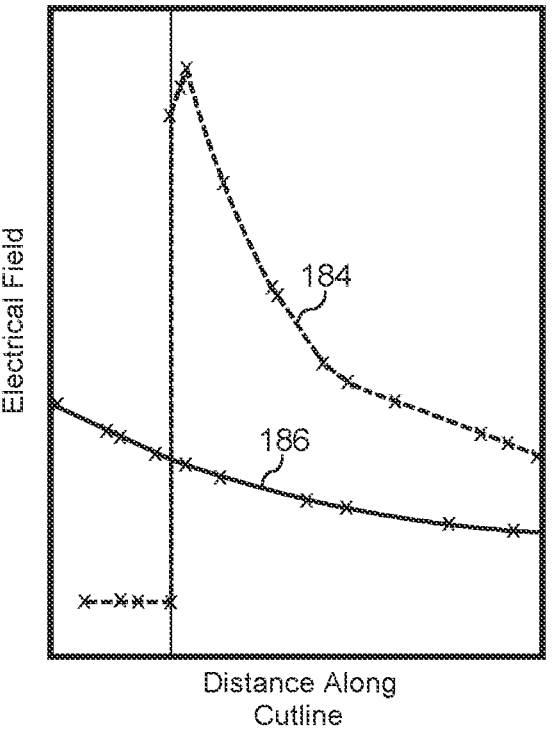

FIGS. 8A, 8B, and 8C provide a comparison of peak electric field of transistor devices with structures having sharp corners relative to transistor devices with structures having rounded corners according to example embodiments of the present disclosure. More particularly. FIG. 8A depicts a simulation of two-dimensional electric field distribution for an HEMT device with metal structures with sharp corners at a drain-source voltage (Vds) equal to about 150V and gate source voltage (Vgs) equal to about –8V. FIG. 8B depicts a simulation of two-dimensional electric field distribution for an HEMT device with metal structures with rounded corners according to example embodiments of the present disclosure at a drain-source voltage (Vds) equal to about 150V and gate source voltage (Vgs) equal to about –8V.

FIG. 8C depicts a electric field along cutline 182 in FIGS. 8A and 8B. FIG. 8C plots distance along the cutline 182 along the horizontal axis and electric field along the vertical axis. Curve 184 represents the electric field for the HEMT device with sharp corners in FIG. 8A. Curve 186 represents the electric field for the HEMT device with rounded corners in FIG. 8B. As demonstrated in FIG. 8C, the HEMT device with rounded corners demonstrates a reduction in peak electric field along cutline 176 at a location between the field plate 126 and the semiconductor structure 102.

Figure 9:
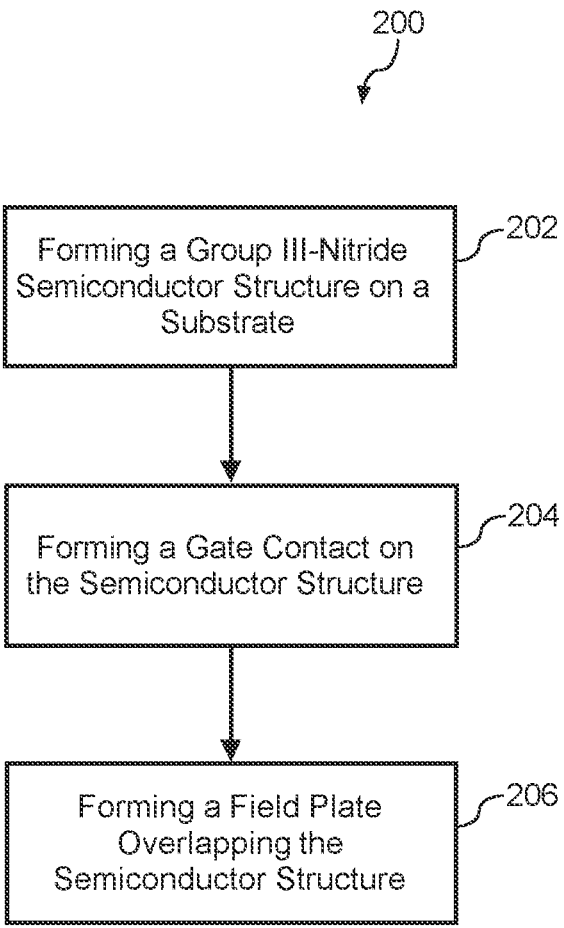
FIG. 9 depicts a flow diagram of an example method according to example embodiments of the present disclosure.

FIG. 9 depicts a flow chart of an example method 200 according to example embodiments of the present disclosure. FIG. 9 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

At 202, the method 200 may include forming a Group III-nitride semiconductor structure on a substrate. For instance, the method 200 may include forming a Group III-nitride semiconductor structure 102 on a substrate 104, such as a silicon carbide substrate 104. The semiconductor structure 102 may be a multilayer structure and may include one or more of a barrier layer 108, a channel layer 106, and other layers. Details concerning these example layers are described above with reference to FIG. 1. The Group III-nitride semiconductor structure may be formed, for instance, using metal-organic chemical vapor deposition (MOCVD), molecular beam epitaxy (MBE), or hydride vapor phase epitaxy (HVPE).

At 204, the method 200 may include forming a gate contact on the semiconductor structure. For instance, the method 200 may include forming a gate contact 116 on a semiconductor structure 102 as shown in FIG. 1. The material of the gate contact 116 may be chosen based on the composition of the barrier layer 108, and may, in some embodiments, be a Schottky contact. Materials capable of making a Schottky contact to a Group III-nitride based semiconductor material may be used, such as, for example, nickel (Ni), platinum (Pt), nickel silicide (NiSi$_x$), copper (Cu), palladium (Pd), chromium (Cr), tungsten (W) and/or tungsten silicon nitride (WSiN). The gate contact may be formed using a suitable metal deposition process, such as a chemical vapor deposition (CVD) process, a physical vapor deposition (PVD) process, a sputtering process, an atomic layer deposition (ALD) process, or other suitable deposition process.

In some examples, as described with reference to FIG. 2, the gate contact 116 may be a T-gate. The gate contact 116 may have first overhang portion 142 extending toward a drain contact (not shown). The gate contact 116 may have a second overhang portion 144 extending toward a source contact (not shown). The first overhang portion 142 and the second overhang portion 144 may each at least partially overlap the semiconductor structure 102. In this way, the gate contact 116 forms a T-shape. In some examples, the gate contact 116 may be a gamma gate.

According to example embodiments of the present disclosure, the gate contact may include one or more rounded corners. For instance, as described with reference to FIG. 2, the gate contact 116 may include a rounded corner 146 in the first overhang portion 142 extending toward the drain contact (not shown in FIG. 2). In addition or in the alternative, the gate contact 116 may include a rounded corner 148 in the second overhang portion 144 extending toward the source contact (not shown in FIG. 2). In addition or in the alternative, the gate contact 116 may include a rounded corner 152 at a top surface 156 of the gate contact. As used herein, the top surface 156 of the gate contact 116 refers to the surface away from the semiconductor structure 102. The rounded corner 152 may be at an intersection of the top surface 156 and a side surface 158 of the gate contact 116. In addition or in the alternative, the gate contact 116 may include a rounded corner 154 in the top surface 156 of the gate contact 116 at an intersection of the top surface 156 and a side surface 160 of the gate contact 116.

The rounded corner(s) of the gate contact may have a radius of curvature in a range of about 10 nm to about 400 nm, such as in a range of about 100 nm to about 200 nm. In some examples, the rounded corner(s) of the gate contact may be based on an ellipse or circles of varying radius such that the at least one rounded corner has a varying radius of curvature along the at least one rounded corner.

In addition and/or in the alternative to forming the gate contact with rounded corners at 204, the method 200 may include at 206 forming a field plate at least partially overlapping at least a portion of the Group III-nitride semiconductor structure. For instance, the method 200 may include forming a field plate 126 at least partially overlapping the Group III-semiconductor structure 102 as illustrated in FIGS. 1-3. The field plate may be formed using, for instance, a metallization process or other metal deposition process, such as a chemical vapor deposition (CVD) process, a physical vapor deposition (PVD) process, a sputtering process, an atomic layer deposition (ALD) process, or other suitable deposition process.

According to example aspects of the present disclosure, the field plate may have one or more rounded corners. For instance, as described with reference to FIG. 2, the field plate 126 may include a rounded corner 162. The rounded corner 162 may be located at least partially overlapping the gate contact 116. The dielectric layer 124 may be between the rounded corner 162 and the top surface 156 of the gate contact 116. In addition or in the alternative, the field plate 126 may include a rounded corner 164. The rounded corner 164 may be located at a portion of the field plate 126 (e.g., on a lower surface 168 of the field plate 126) extending toward the gate contact 116. The dielectric layer 124 may be between the rounded corner 164 and the side surface 158 of the gate contact 116. In addition or in the alternative, the field plate 126 may include a rounded corner 166. The rounded corner 166 may be located at a portion of the field plate 126 (e.g., on a lower surface 168 of the field plate 126) extending away from the gate contact 116. The rounded corner 166 may be at least partially overlapping the semiconductor structure 102 and not overlapping the gate contact 116.

The rounded corner(s) of the field plate may have a radius of curvature in a range of about 10 nm to about 400 nm, such as in a range of about 100 nm to about 200 nm. In some examples, the rounded corner(s) of the field plate may be based on an ellipse or circles of varying radius such that the at least one rounded corner has a varying radius of curvature along the at least one rounded corner.

Example aspects of the present disclosure are set forth below. Any of the below features or examples may be used in combination with any of the embodiments or features provided in the present disclosure.

One example aspect of the present disclosure is directed to a transistor device. The transistor device includes a Group III-nitride semiconductor structure. The transistor device includes a gate contact on the Group III-nitride semiconductor structure. The gate contact includes at least one rounded corner.

In some examples, the at least one rounded corner has a radius of curvature in a range of about 10 nm to about 400 nm.

In some examples, the at least one rounded corner has a radius of curvature in a range of about 100 nm to about 200 nm.

In some examples, the at least one rounded corner has a varying radius of curvature transitioning from a first radius of curvature to a second radius of curvature along the at least one rounded corner.

In some examples, the gate contact comprises an overhang portion of the gate contact, the overhang portion extending toward a source contact or a drain contact of the transistor device, wherein the at least one rounded corner forms a part of the overhang portion. In some examples, the gate contact comprises a T-gate or a gamma gate.

In some examples, the at least one rounded corner is located at an intersection between a top surface of the gate contact and a side surface of the gate contact.

In some examples, the transistor device further comprises a field plate. In some examples, the field plate has at least one second rounded corner.

In some examples, the at least one second rounded corner has a radius of curvature of in a range of about 10 nm to about 400 nm.

In some examples, the at least one second rounded corner has a radius of curvature in a range of about 100 nm to about 200 nm.

In some examples, the at least one second rounded corner has a varying radius of curvature transitioning from a first radius of curvature to a second radius of curvature along the at least one second rounded corner.

In some examples, the at least one second rounded corner is located at a portion of the field plate at least partially overlapping the gate contact.

In some examples, the at least one second rounded corner is located at a portion of the field plate extending away from the gate contact.

In some examples, the at least one second rounded corner is located at a portion of the field plate extending toward the gate contact but not overlapping the gate contact.

In some examples, the Group III-nitride semiconductor structure comprises a barrier layer, a channel layer, and a two-dimensional electron gas (2DEG) at an interface between the channel layer and the barrier layer.

In some examples, the channel layer comprises $Al_wGa_{1-w}N$, where x is $0 \leq x \leq 0.1$, wherein the barrier layer comprises $Al_xGa_{1-x}N$, where x is $0.1 \leq x \leq 0.4$.

In some examples, the Group III-nitride semiconductor structure is on a substrate, the substrate comprising silicon carbide.

In some examples, the transistor device comprises a high electron mobility transistor.

Another example aspect of the present disclosure is directed to s transistor device. The transistor device includes a Group III-nitride semiconductor structure. The transistor device includes a field plate at least partially overlapping the Group III-nitride semiconductor structure. The field plate includes at least one rounded corner.

In some examples, the at least one rounded corner has a radius of curvature in a range of about 10 nm to about 400 nm.

In some examples, the at least one rounded corner has a radius of curvature in a range of about 100 nm to about 200 nm.

In some examples, the at least one rounded corner has a varying radius of curvature transitioning from a first radius of curvature to a second radius of curvature along the at least one rounded corner.

In some examples, the at least one rounded corner is located at a portion of the field plate at least partially overlapping a gate contact.

In some examples, the at least one rounded corner is located at a portion of the field plate extending away from a gate contact.

In some examples, the at least one rounded corner is located at a portion of the field plate extending toward a gate contact but not overlapping the gate contact.

In some examples, the transistor device includes a gate contact, the gate contact comprising an overhang portion extending toward a source contact or a drain contact of the transistor device, wherein the transistor device comprises at least one second rounded corner forming a part of the overhang portion.

In some examples, the gate contact comprises a T-gate or a gamma gate.

In some examples, the at least one second rounded corner has a radius of curvature in a range of about 10 nm to about 400 nm.

In some examples, the at least one second rounded corner has a radius of curvature in a range of about 100 nm to about 200 nm.

In some examples, the at least one second rounded corner has a varying radius of curvature transitioning from a first radius of curvature to a second radius of curvature along the at least one rounded corner.

In some examples, the Group III-nitride semiconductor structure comprises a barrier layer, a channel layer, and a two-dimensional electron gas (2DEG) at an interface between the channel layer and the barrier layer.

In some examples, the channel layer comprises $Al_wGa_{1-w}N$, where w is $0 \leq w \leq 0.1$. wherein the barrier layer comprises $Al_xGa_{1-x}N$, where x is $0.1 \leq x < 0.4$.

In some examples, the Group III-nitride semiconductor structure is on a substrate, the substrate comprising silicon carbide.

In some examples, the transistor device comprises a high electron mobility transistor.

Another example aspect of the present disclosure is directed to a transistor device. The transistor device includes a substrate. The transistor device includes a Group III-nitride semiconductor structure on the substrate. The Group III-nitride semiconductor structure includes a barrier layer and a channel layer. The barrier layer has a different bandgap relative to the channel layer. The transistor device includes a gate contact, source contact, and a drain contact. The gate contact has an overhang portion extending toward the drain contact or the source contact. The gate contact includes a first rounded corner forming a part of the overhang portion. The gate contact includes a second rounded corner at an intersection between a top surface of the gate contact and a side surface of the gate contact.

In some examples, the gate contact is a T-gate or a gamma gate.

In some examples, the first rounded corner and the second rounded corner each have a radius of curvature in a range of about 10 nm to about 400 nm.

In some examples, the first rounded corner and the second rounded corner each have a radius of curvature in a range of about 100 nm to about 200 nm.

In some examples, the first rounded corner and the second rounded corner each have a varying radius of curvature.

In some examples, the transistor device further comprises a field plate, wherein the field plate has a third rounded corner at a portion of the field plate at least partially overlapping the gate contact, a fourth rounded corner at a portion of the field plate extending away from a gate contact, and a fifth rounded corner at a portion of the field plate extending toward the gate contact but not overlapping the gate contact.

Another example aspect of the present disclosure is directed to a transistor device. The transistor device includes a Group III-nitride semiconductor structure on the substrate. The Group III-nitride semiconductor structure includes a barrier layer and a channel layer. The barrier layer has a different bandgap relative to the channel layer. The transistor device includes a gate contact, source contact, and a drain contact. The transistor device includes a field plate. The field plate has a first rounded corner at a portion of the field plate at least partially overlapping the gate contact, a second rounded corner at a portion of the field plate extending away from a gate contact, and a third rounded corner at a portion of the field plate extending toward the gate contact but not overlapping the gate contact.

In some examples, the first rounded corner, the second rounded corner, and the third rounded corner each have a radius of curvature in a range of about 10 nm to about 400 nm.

In some examples, the first rounded corner, the second rounded corner, and the third rounded corner each have a radius of curvature in a range of about 100 nm to about 200 nm.

In some examples, the first rounded corner, the second rounded corner, and the third rounded corner each have a varying radius of curvature.

Another example aspect of the present disclosure is directed to a method of forming a transistor device. The method includes forming a group III-nitride semiconductor structure on a substrate. The method includes forming a gate contact on the Group III-nitride semiconductor structure. The gate contact includes at least one rounded corner.

In some examples, the at least one rounded corner has a radius of curvature in a range of about 10 nm to about 400 nm.

In some examples, the at least one rounded corner has a radius of curvature in a range of about 100 nm to about 200 nm.

In some examples, the at least one rounded corner has a varying radius of curvature transitioning from a first radius of curvature to a second radius of curvature along the at least one rounded corner.

In some examples, the gate contact comprises an overhang portion of the gate contact, the overhang portion extending toward a source contact or a drain contact of the transistor device, wherein the at least one rounded corner forms a part of the overhang portion.

In some examples, the gate contact comprises a T-gate or a gamma gate.

In some examples, the at least one rounded corner is located at an intersection between a top surface of the gate contact and a side surface of the gate contact.

In some examples, the method further comprises forming a field plate, wherein the field plate has at least one second rounded corner.

In some examples, the at least one second rounded corner has a radius of curvature of in a range of about 10 nm to about 400 nm.

In some examples, the at least one second rounded corner has a radius of curvature in a range of about 100 nm to about 200 nm.

In some examples, the at least one second rounded corner has a varying radius of curvature transitioning from a first radius of curvature to a second radius of curvature along the at least one second rounded corner.

In some examples, the substrate is a silicon carbide substrate.

Another example aspect of the present disclosure is directed to a method of forming a transistor device. The method may include forming a group III-nitride semiconductor structure on a substrate. The method may include forming a field plate at least partially overlapping the Group III-nitride semiconductor structure. The field plate includes at least one rounded corner.

In some examples, the at least one rounded corner has a radius of curvature in a range of about 10 nm to about 400 nm.

In some examples, the at least one rounded corner has a radius of curvature in a range of about 100 nm to about 200 nm.

In some examples, the at least one rounded corner has a varying radius of curvature transitioning from a first radius of curvature to a second radius of curvature along the at least one rounded corner.

In some examples, the at least one rounded corner is located at a portion of the field plate at least partially overlapping a gate contact.

In some examples, the at least one rounded corner is located at a portion of the field plate extending away from a gate contact.

In some examples, the at least one rounded corner is located at a portion of the field plate extending toward a gate contact but not overlapping the gate contact.

In some examples, the substrate is a silicon carbide substrate.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A transistor device, comprising:
a Group III-nitride semiconductor structure;
a gate contact on the Group III-nitride semiconductor structure; and
wherein the gate contact comprises at least one rounded corner located at:
an intersection between a top surface of the gate contact and a side surface of the gate contact; or
an intersection between a bottom surface of the gate contact and the side surface of the gate contact.

2. The transistor device of claim 1, wherein the at least one rounded corner has a radius of curvature in a range of about 10 nm to about 400 nm.

3. The transistor device of claim 1, wherein the at least one rounded corner has a varying radius of curvature transitioning from a first radius of curvature to a second radius of curvature along the at least one rounded corner.

4. The transistor device of claim 1, wherein the gate contact comprises an overhang portion of the gate contact, the overhang portion extending toward a source contact or a drain contact of the transistor device, wherein the at least one rounded corner forms a part of the overhang portion.

5. The transistor device of claim 4, wherein the gate contact comprises a T-gate or a gamma gate.

6. The transistor device of claim 1, wherein the transistor device further comprises a field plate.

7. The transistor device of claim 6, wherein the field plate has at least one second rounded corner.

8. The transistor device of claim 7, wherein the at least one second rounded corner has a radius of curvature in a range of about 10 nm to about 400 nm.

9. The transistor device of claim 7, wherein the at least one second rounded corner has a varying radius of curvature transitioning from a first radius of curvature to a second radius of curvature along the at least one second rounded corner.

10. The transistor device of claim 7, wherein the at least one second rounded corner is located at a portion of the field plate at least partially overlapping the gate contact.

11. The transistor device of claim 7, wherein the at least one second rounded corner is located at a portion of the field plate extending away from the gate contact.

12. The transistor device of claim 7, wherein the at least one second rounded corner is located at a portion of the field plate extending toward the gate contact but not overlapping the gate contact.

13. The transistor device of claim 1, wherein the Group III-nitride semiconductor structure comprises a barrier layer, a channel layer, and a two-dimensional electron gas (2DEG) at an interface between the channel layer and the barrier layer.

14. The transistor device of claim 13, wherein the channel layer comprises $Al_wGa_{1-w}N$, wherein w is $0 \leq w \leq 0.1$, wherein the barrier layer comprises $Al_xGa_{1-x}N$, wherein x is $0.1 \leq x \leq 0.4$.

15. The transistor device of claim 1, wherein the Group III-nitride semiconductor structure is on a substrate, the substrate comprising silicon carbide.

16. The transistor device of claim 1, wherein the transistor device comprises a high electron mobility transistor.

17. A transistor device, comprising:
a Group III-nitride semiconductor structure;
a field plate at least partially overlapping the Group III-nitride semiconductor structure; and
wherein the field plate comprises at least one rounded corner located at an intersection between a lower surface of the field plate and a side surface of the field plate.

18. A transistor device, comprising:
a substrate;
a Group III-nitride semiconductor structure on the substrate, the Group III-nitride semiconductor structure comprising a barrier layer and a channel layer, the barrier layer having a different bandgap relative to the channel layer;
a gate contact, source contact, and a drain contact, the gate contact having an overhang portion extending toward the drain contact or the source contact;
wherein the gate contact comprises a first rounded corner forming a part of the overhang portion; and
wherein the gate contact comprises a second rounded corner at an intersection between a top surface of the gate contact and a side surface of the gate contact.

19. The transistor device of claim 18, wherein the transistor device further comprises a field plate, wherein the field plate has a third rounded corner at a portion of the field plate at least partially overlapping the gate contact, a fourth rounded corner at a portion of the field plate extending away from the gate contact, and a fifth rounded corner at a portion of the field plate extending toward the gate contact but not overlapping the gate contact.

* * * * *